US008766101B2

(12) United States Patent
Miyairi et al.

(10) Patent No.: US 8,766,101 B2
(45) Date of Patent: Jul. 1, 2014

(54) WIRING SUBSTRATE, METHOD FOR MANUFACTURING WIRING SUBSTRATE, AND SEMICONDUCTOR PACKAGE INCLUDING WIRING SUBSTRATE

(75) Inventors: Ken Miyairi, Grenoble (FR); Akihito Takano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 208 days.

(21) Appl. No.: 13/571,580

(22) Filed: Aug. 10, 2012

(65) Prior Publication Data
US 2013/0056251 A1 Mar. 7, 2013

(30) Foreign Application Priority Data

Sep. 7, 2011 (JP) .................................. 2011-195456

(51) Int. Cl.
| | |
|---|---|
| H05K 1/03 | (2006.01) |
| H05K 1/11 | (2006.01) |
| H05K 1/00 | (2006.01) |
| H05K 3/10 | (2006.01) |
| H05K 3/40 | (2006.01) |
| H05K 3/46 | (2006.01) |
| H05K 3/34 | (2006.01) |
| H01L 23/00 | (2006.01) |

(52) U.S. Cl.
CPC ................ *H05K 1/00* (2013.01); *H05K 3/4644* (2013.01); *H05K 3/3436* (2013.01); *H05K 3/4605* (2013.01); *H01L 24/00* (2013.01); *H05K 3/10* (2013.01); *H05K 3/4007* (2013.01)
USPC ........... 174/255; 174/256; 174/262; 174/263; 174/264; 174/265; 174/266

(58) Field of Classification Search
USPC ............. 174/255, 256, 258, 262–266; 29/846
See application file for complete search history.

(56) References Cited

U.S. PATENT DOCUMENTS

| | | | |
|---|---|---|---|
| 7,226,654 B2 * | 6/2007 | Kawai et al. .................. 428/210 |
| 2002/0011353 A1 * | 1/2002 | Kamath et al. ................ 174/260 |
| 2002/0092676 A1 * | 7/2002 | Jimarez et al. ................ 174/262 |
| 2007/0080458 A1 | 4/2007 | Ogawa et al. | |

FOREIGN PATENT DOCUMENTS

| | | |
|---|---|---|
| JP | 2006-270037 | 10/2006 |
| WO | WO2005/114728 | 12/2005 |

* cited by examiner

*Primary Examiner* — Timothy Thompson
*Assistant Examiner* — Sherman Ng
(74) *Attorney, Agent, or Firm* — IPUSA, PLLC

(57) ABSTRACT

A wiring substrate includes an inorganic substrate including a substrate body formed of an inorganic material, a wiring pattern formed on the substrate body, and an external connection terminal being electrically connected to the wiring pattern, an organic substrate that is formed below the inorganic substrate, the organic substrate including an insulating layer and a wiring layer formed on the insulating layer, and a bonding layer interposed between the inorganic substrate and the organic substrate, the bonding layer including a stress buffer layer and a penetration wiring that penetrates the stress buffer layer. A thermal expansion coefficient of the stress buffer layer is greater than a thermal expansion coefficient of the inorganic substrate and less than a thermal expansion coefficient of the organic substrate. The wiring pattern and the wiring layer are electrically connected by way of the penetration wiring.

15 Claims, 15 Drawing Sheets

WIRING SUBSTRATE, METHOD FOR MANUFACTURING WIRING SUBSTRATE, AND SEMICONDUCTOR PACKAGE INCLUDING WIRING SUBSTRATE

CROSS-REFERENCE TO RELATED APPLICATIONS

This application is based upon and claims the benefit of priority of the prior Japanese Patent Application No. 2011-195456 filed on Sep. 7, 2011, the entire contents of which are incorporated herein by reference.

FIELD

The embodiments discussed herein are related to, for example, a wiring substrate for mounting a semiconductor chip thereon, a method for manufacturing the wiring substrate, and a semiconductor package having a semiconductor chip mounted on the wiring substrate.

BACKGROUND

Conventionally, various types of wiring substrates are proposed for mounting a semiconductor chip thereon.

For example, there is proposed a wiring substrate that includes a first wiring part having plural wiring layers, a second wiring part mounted on the first wiring part and having a thermal expansion rate smaller than that of the first wiring part, and a semiconductor chip mounted on the second wiring part and having a thermal expansion rate substantially equal to that of the second wiring part. Further, there is proposed a wiring substrate that includes a wiring pattern formed on a silicon substrate.
Patent Document 1: Japanese Laid-Open Patent Publication No. 2006-270037
Patent Document 2: International Publication Pamphlet No. WO 05/114728

A wiring substrate for mounting a semiconductor chip thereon is desired to have a connection reliability that can endure stress caused by the difference of thermal expansion rates. It is also desired for the wiring substrate to be capable of forming narrow pitch external connection terminals (e.g., solder bumps) in correspondence with electrode terminals of the semiconductor chip.

SUMMARY

According to an aspect of the invention, there is provided a wiring substrate including: an inorganic substrate including a substrate body formed of an inorganic material, a wiring pattern formed on the substrate body, and an external connection terminal being electrically connected to the wiring pattern; an organic substrate that is formed below the inorganic substrate, the organic substrate including an insulating layer and a wiring layer formed on the insulating layer; and a bonding layer interposed between the inorganic substrate and the organic substrate, the bonding layer including a stress buffer layer and a penetration wiring that penetrates the stress buffer layer. A thermal expansion coefficient of the stress buffer layer is greater than a thermal expansion coefficient of the inorganic substrate and less than a thermal expansion coefficient of the organic substrate. The wiring pattern and the wiring layer are electrically connected by way of the penetration wiring.

The object and advantages of the invention will be realized and attained by means of the elements and combinations particularly pointed out in the claims.

It is to be understood that both the foregoing generation description and the followed detailed description are exemplary and explanatory and are not restrictive of the invention as claimed.

DESCRIPTION OF EMBODIMENTS

In the following, embodiments of the present invention are described with reference to the accompanying drawings.

First Embodiment

Structure of Wiring Substrate of First Embodiment

Figure 1:
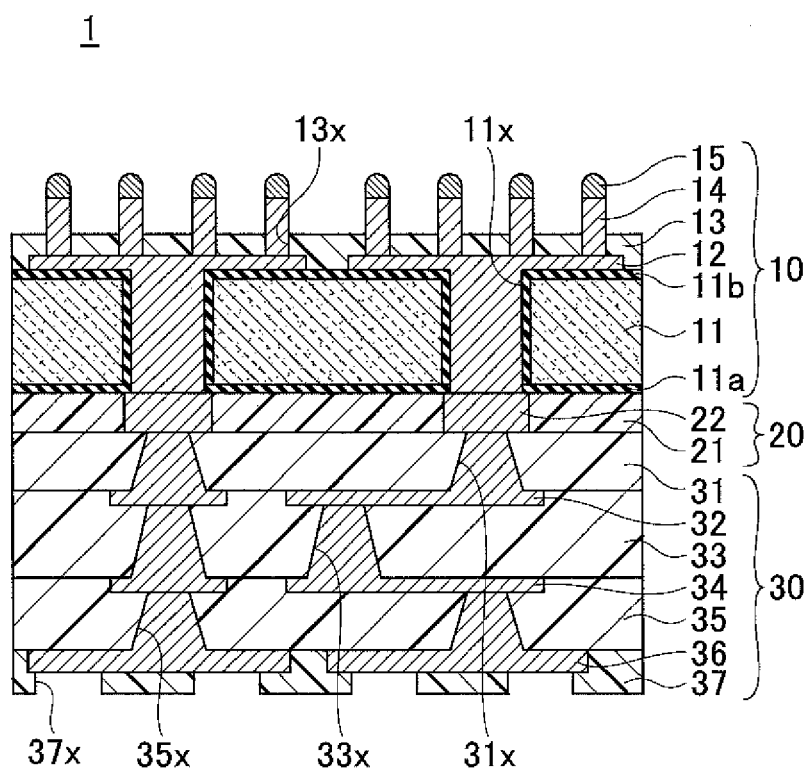
FIG. 1 is a cross-sectional view illustrating a wiring substrate according to an embodiment of the present invention.

First, a structure of a wiring substrate according to the first embodiment of the present invention is described. FIG. 1 is a cross-sectional view illustrating a wiring substrate 1 according to an embodiment of the present invention. With reference to FIG. 1, the wiring substrate 1 includes, for example, an inorganic substrate 10, a bonding layer 20, and an organic substrate 30. The inorganic substrate 10 and the organic substrate 30 are bonded by way of a stress buffer layer 21 of the bonding layer 20. In the following, the term "first surface" refers to a surface that is positioned toward a side of the wiring substrate 1 on which a mounting substrate is to be mounted (mounting substrate side), and the term "second surface" refers to a surface that is positioned toward a side of the wiring substrate 1 on which a semiconductor chip is to be mounted (semiconductor chip side). For example, in FIG. 1, the side of the wiring substrate 1 on which the below-described insulating layer 37 is formed corresponds to the mounting substrate side whereas the side of the wiring substrate 1 on which the below-described metal layer 15 is formed corresponds to the semiconductor chip side.

The inorganic substrate 10 includes, for example, a substrate body 11, a wiring pattern 12, an insulating layer 13, a metal column 14, and a metal layer 15. One surface of the inorganic substrate 10 contacts the bonding layer 20.

The substrate body 11 is a part of the inorganic substrate 10 serving as a base substrate on which the wiring pattern 12 or the like is formed. The substrate body 11 has a first surface on the mounting substrate side thereof and a second surface on the semiconductor chip side thereof. For example, the substrate body 11 is formed of an inorganic material such as silicon or glass. By using an inorganic material to form the substrate boy 11, the substrate body 11 is able to attain a low thermal expansion coefficient. For example, the thermal expansion coefficient of silicon is approximately 3 ppm/° C., and the thermal expansion coefficient of glass such as borosilicate glass is approximately 3 ppm/° C.

The thickness of the substrate body 11 is, for example, approximately 20 μm to 300 μm. A via hole(s) 11x is formed in the substrate body 11. The shape of the via hole 11x is, for example, a circle in plan view. The diameter of the circular-shaped via hole 11x may be, for example, approximately 20 μm to approximately 200 μm. The following embodiment is an example where silicon is used as the material of the substrate body 11.

The wiring pattern 12 includes a via wiring that fills the inside of the via hole 11x and a flat wiring formed on a second surface of the substrate body 11. The wiring pattern 12 is electrically connected to the below-described penetration wiring 22 exposed in the via hole 11x. For example, a metal material having copper (Cu) as a main component may be used as the material of the wiring pattern 12. The line/space of the wiring pattern 12 may be, for example, approximately 1 μm/1 μm.

Because silicon is not an insulator, an insulating film 11a (e.g., $SiO_2$ film) is formed on the first surface of the substrate body 11. Further, an insulating film 11b (e.g., $SiO_2$) is formed on the second surface of the substrate body 11 and on an inner wall surface of the via hole 11x. The wiring pattern 12 is formed on the second surface of the substrate body 11 interposed by the insulating film 11b. In a case where an insulator such as glass is used as the substrate body 11, the insulating film 11a need not be formed on the first surface of the substrate body 11. Likewise, the insulating film 11b need not be formed on the second surface of the substrate body 11 and the insulating film 11b in the case where an insulator such as glass is used as the substrate body 11.

The insulating layer 13 is formed covering the wiring pattern 12 on the second surface of the wiring substrate 11. The insulating layer 13 is a so-called solder resist layer. The insulating layer 13 has an opening part(s) 13x. A part of the wiring pattern 12 is exposed in the opening part 13x. For example, a photoconductive resin compound (e.g., epoxy type resin, acrylic resin) may be used as the material of the insulating layer 13.

A metal layer may be formed on the wiring pattern 12 exposed in the opening part 13x according to necessity. The metal layer may be formed by, for example, an electroless plating method. The metal layer may be, for example, a gold layer, a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

The metal column 14 is provided on the wiring pattern 12 exposed in the opening part 13x. A part of the metal column 14 projects from the second surface of the insulating layer 13. For example, a circular column-shaped copper pillar may be used as the metal column 14. The diameter of the metal column 14 may be, for example, approximately 20 μm. The height of the metal column 14 may be, for example, approximately 10 μm to 50 μm. The pitch between the metal columns 14 may be, for example, approximately 40 μm. It is, however, to be noted that the shape of the metal column 14 is not limited to a circular column but also other shapes such as a rectangular column.

The metal layer 15 is formed covering the second surface of the metal column 14. The metal layer 15 may have, for example, a dome-like shape. The term "dome-like" refers to a configuration that becomes higher toward the vicinity of its center part and lower toward its peripheral part. The height of the metal column 14 (height of the center part of the metal column) may be, for example, approximately 10 μm.

For example, solder may be used as the material of the metal layer 15. The solder may be, for example, an alloy including lead (Pb), an alloy including tin (Sn) and copper (Cu), or an alloy including tin (Sn), silver (Ag), and copper (Cu). Alternatively, the material of the metal layer 15 may be, for example, a copper/nickel/gold (Cu/Ni/Au) layer (i.e. metal layer including a Cu layer, a Ni layer, and a Au layer layered in this order) or a copper/nickel/palladium/gold (Cu/Ni/Pd/Au) layer (i.e. meta layer including a Cu layer, a Ni layer, a Pd layer, and a gold layer layered in this order). The metal layer 15 is a portion to which a pad of a semiconductor chip is electrically connected when the semiconductor chip is mounted on the wiring substrate 1.

The bonding layer 20 includes the stress buffer layer 21, and the penetration wiring 22 that penetrates the stress buffer layer 21. The stress buffer layer 21 is formed of an elastic material or a material having a low thermal expansion coefficient. In this embodiment, the material having a low thermal expansion coefficient includes a material having Young's modulus of approximately 50 MPa to 1000 MPa. Because the elastic material is used as the material of the stress buffer layer 21, the stress buffer layer 21 can contract and absorb the stress generated at a bonding part between the inorganic substrate 10 and the organic substrate 30. Thereby, the connection reliability between the inorganic substrate 10 and the organic substrate 30 can be improved.

In this embodiment, the material having the low thermal expansion coefficient refers to a material having a thermal expansion coefficient higher than that of the inorganic substrate 10 but lower than that of the organic substrate 30. The thermal expansion coefficient of the stress buffer layer 21 is preferably approximately 7 ppm/° C. to 13 ppm/° C. By using the material having a low thermal expansion coefficient as the material of the stress buffer layer 21, the inorganic substrate 10 and the organic substrate 20 can be firmly fixed to each other. Therefore, even in a case where stress is generated at the bonding part between the inorganic substrate 10 and the organic substrate 30, the inorganic substrate 10 and the organic substrate 30 are prevented from moving at the bonding part. Accordingly, connection reliability between the inorganic substrate 10 and the organic substrate 30 can be improved.

For example, the material of the stress buffer layer 21 is an insulating resin such as an epoxy type resin, a polyimide type resin, a phenol type resin, or an acrylic type resin. The stress buffer layer 21 may include a filler such as silica ($SiO_2$). The thickness of the stress buffer layer 21 may be, for example, approximately 5 μm to 30 μm.

In a case of using an elastic material as the material of the stress buffer layer 21, it is preferable to select a material having Young's modulus of 50 MPa to 1000 MPa. The Young's modulus of the elastic material can be adjusted by appropriately designing a molecular structure of the insulating resin (e.g., acrylic type resin).

In a case of using a material having a low thermal expansion coefficient as the material of the stress buffer layer 21, the thermal expansion coefficient can be adjusted, for example, by adjusting the amount of filler (e.g., silica ($SiO_2$)) included in the insulating resin (e.g., epoxy type resin, polyimide type resin, phenol type resin, acrylic type resin) constituting the stress buffer layer 21. The more the filler is included in the stress buffer layer 21, the less the thermal expansion coefficient of the stress buffer layer 21 becomes. It is, however, to be noted that the filler included in the stress buffer layer 21 is not limited to silica ($SiO_2$). For example, alumina ($Al_2O_3$) may be used as the filler included in the stress buffer layer 21.

The penetration wiring 22 penetrates the stress buffer layer 21 from the first surface of the stress buffer layer 21 to the second surface of the stress buffer layer 21. For example, a metal material having copper (Cu) as a main component may be used as the material of the penetration wiring 22. The penetration wiring 22 electrically connects the wiring pattern 12 of the inorganic substrate 10 and the below-described wiring layer 32 of the organic substrate 30. The first surface of the stress buffer layer 21 and one end surface (an end surface positioned toward mounting substrate side) of the penetration wiring 22 may be substantially flush with each other. Likewise, the second surface of the stress buffer layer 21 and another end surface (an end surface positioned toward the semiconductor chip side) of the penetration wiring 22 may be substantially flush with each other. The penetration wiring 22 has a shape of, for example, a circle in plan view. The diameter of the circle-shaped penetration wiring 22 is, for example, approximately 20 μm to 200 μm.

The organic substrate 30 is a substrate having an organic material as a main component. For example, the organic material of the organic substrate 30 may be an insulating resin having a thermoplastic property or a thermosetting property. The organic substrate 30 includes, for example, an insulating layer 31, a wiring layer 32, an insulating layer 33, a wiring layer 34, an insulating layer 35, a wiring layer 36, and an insulating layer 37. The thermal expansion coefficient of the organic substrate 30 is adjusted, so that the value of the thermal expansion coefficient of the entire organic substrate 30 is greater than that of the stress buffer layer 21 and less than that of a mounting substrate (e.g., motherboard). The thermal expansion coefficient of the entire organic substrate 30 may be adjusted to, for example, approximately 13 ppm/° C. to 20 ppm/° C.

Further, the thermal expansion coefficient of the inorganic substrate 10 is adjusted, so that the value of the thermal expansion coefficient of the entire inorganic substrate 10 is less than that of the stress buffer layer 21. The thermal expansion coefficient of the entire inorganic substrate 10 may be adjusted to, for example, approximately 3 ppm/° C. to 7 ppm/° C. Further, the Young's modulus of the entire organic substrate 30 is greater than that of the stress buffer layer 21. For example, the Young's modulus of the entire organic substrate 30 may be approximately 2 GPa to 5 GPa. It is to be noted that the thermal expansion coefficient of the entire mounting board (e.g., motherboard) may be, for example, approximately 20 ppm/° C. to 50 ppm/° C.

The wiring layer 32 is formed on a first surface of the insulating layer 31. A second surface of the insulating layer 31 contacts the first surface of the stress buffer layer 21 and the first end surface of the penetration wiring 22. The insulating layer 31 includes, for example, an insulating resin having an epoxy type resin as a main component. The insulating layer 31 may include a filler such as silica ($SiO_2$). The thickness of the insulating layer 31 may be, for example, approximately 20 μm to 50 μm.

The wiring layer 32, which penetrates the insulating layer 31, includes a via wiring that fills the inside of a via hole 31x and a wiring pattern that is formed on the first surface of the insulating layer 31. The via hole 31x exposes the first end surface of the penetration wiring 22. The via hole 31x has a shape in which its opening toward the insulating layer 33 has a larger area than that of its opening toward the penetration wiring 22. The wiring layer 32 is electrically connected to the penetration wiring 22 exposed in the via hole 31x. For example, a metal material having copper (Cu) as a main component may be used as the material of the wiring layer 32. The thickness of the wiring layer 32 may be, for example, approximately 10 μm to 20 μm.

The insulating layer 33 is formed covering the wiring layer 32 on the first surface of the insulating layer 31. The material and the thickness of the insulating layer 33 may be the same as those of the insulating layer 31. The wiring layer 34, which penetrates the insulating layer 33, includes a via wiring that fills the inside of a via hole 33x and a wiring pattern that is formed on the first surface of the insulating layer 33. The via hole 33x exposes the first surface of the wiring layer 32. The via hole 33x has a shape in which its opening toward the insulating layer 35 has a larger area than that of its opening toward the wiring layer 32. The wiring layer 34 is electrically connected to the wiring layer 32 exposed in the via hole 33x. The material and the thickness of the wiring layer 34 may be the same as those of the wiring layer 32.

The insulating layer 35 is formed covering the wiring layer 34 on the first surface of the insulating layer 33. The material and the thickness of the insulating layer 35 may be the same as those of the insulating layer 31. The wiring layer 36, which penetrates the insulating layer 35, includes a via wiring that fills the inside of a via hole 35x and a wiring pattern that is formed on the first surface of the insulating layer 35. The via hole 35x exposes the first surface of the wiring layer 34. The via hole 35x has a shape in which its opening toward the insulating layer 37 has a larger area than that of its opening toward the wiring layer 34. The wiring layer 36 is electrically connected to the wiring layer 34 exposed in the via hole 35x. The material and the thickness of the wiring layer 36 may be the same as those of the wiring layer 32.

The insulating layer 37 is formed covering the first surface of the insulating layer 35. The insulating layer 37 is a so-called solder resist layer. For example, a photosensitive resin compound (e.g., epoxy type resin, acrylic resin) may be used as the material of the insulating layer 37. The thickness of the insulating layer 37 may be substantially the same as the thickness of the insulating layer 31. The insulating layer 37 has an opening part(s) 37x. A part of the wiring pattern 36 is exposed in the opening part 37x. The shape of the wiring layer 36 exposed in the opening part 37x is, for example, a circle in plan view. The diameter of the circle-shaped opening part 37x may be, for example, approximately 200 μm to 1000 μm. The pitch of the wiring layers 36 exposed in the opening parts 37x may be, for example, approximately 500 μm to 1200 μm.

A metal layer may be formed on the wiring layer 36 exposed in the opening part 37x according to necessity. The metal layer may be formed by, for example, an electroless plating method. The metal layer may be, for example, a gold layer, a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). Further, an external connection terminal such as a solder ball or a lead pin may be formed on the wiring layer 36 exposed in the opening part 37x. The external connection terminal acts as a terminal that electrically connects the wiring substrate 1 to the mounting substrate (not illustrated) such as a motherboard. Alternatively, the wiring layer 36 exposed in the opening part 37x may be used as an external connection terminal.

Method for Manufacturing Wiring Substrate of First Embodiment

Next, a method for manufacturing a wiring substrate according to the first embodiment of the present invention is described. FIGS. 2-13 are schematic diagrams for describing the processes in manufacturing the wiring substrate according to the first embodiment of the present invention.

Figure 2:
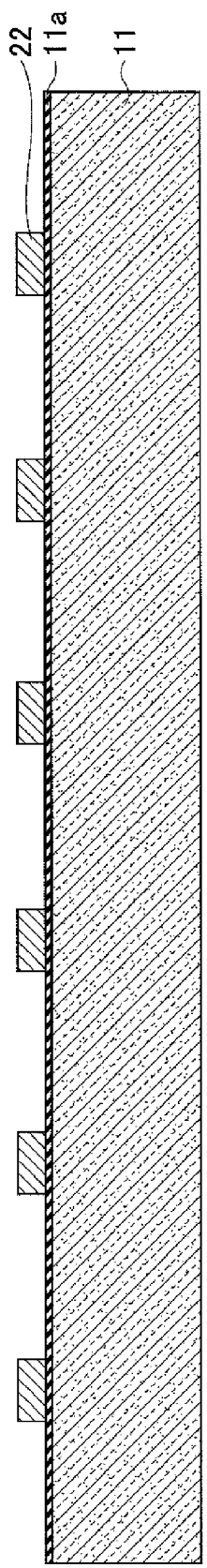
FIGS. 2-13 are schematic diagrams for describing processes performed in a method for manufacturing a wiring substrate according to the first embodiment of the present invention.

Before performing the process illustrated in FIG. 2, the substrate body formed of silicon is prepared, and the insulating film 11a is formed on the first surface of the prepared substrate body 11. For example, the substrate body 11 may be a silicon wafer having a length (diameter) of 6 inches (approximately 150 mm), 8 inches (approximately 200 mm), or 12 inches (approximately 300 mm). The thickness of the silicon wafer may be, for example, 0.625 mm in a case of a 6 inch wafer, 0.725 mm in a case of an 8 inch wafer, or 0.775 mm in a case of a 12 inch wafer.

For example, a thermal oxide film (e.g., $SiO_2$) may be used as the insulating film 11a. The thermal oxide film (e.g., $SiO_2$) may be formed by a wet thermal oxidization method in which the vicinity of the first surface of the substrate body 11 is heated to a temperature of, for example, approximately 1000° C. The thickness of the thermal oxide film (e.g., $SiO_2$) may be, for example, approximately 1.5 µm to 3 µm. Alternatively, the insulating film 11a may be formed by a CVD (Chemical Vapor Deposition) method or a PVD (Physical Vapor Deposition) method.

Then, in the process illustrated in FIG. 2, the penetration wiring 22 having a predetermined flat shape is formed on the first surface of the substrate body 11 interposed by the insulating film 11a. The penetration wiring 22 is formed into the predetermined flat shape by patterning. The thickness of the penetration wiring 22, may be, for example, approximately 5 µm to 30 µm. The penetration wiring 22 may be formed by, for example, a semi-additive method. In the semi-additive method, for example, a first metal layer (not illustrated) including a metal material having copper (Cu) as a main component is formed by an electroless plating method, a CVD method, or a PVD method. Then, a resist layer (not illustrated) provided with an opening part corresponding to the penetration wiring 22 is formed on the first metal layer.

Then, a second metal layer (not illustrated) is layered on the first metal layer exposed in the opening part of the resist layer. The second metal layer, which includes a metal material having copper (Cu) as a main component, is formed by an electroplating method in which the first metal layer is used as the power feeding layer. Then, the resist layer is removed. Then, a part of the first metal layer which is not covered by the second metal layer is removed by using the second metal layer as a mask and etching the part of the first metal layer. Thereby, the penetration wiring 22 having the second metal layer layered on the first metal layer is formed. It is to be noted that the penetration wiring 22 may be formed by using other wiring forming methods such as a subtractive method.

Figure 3:
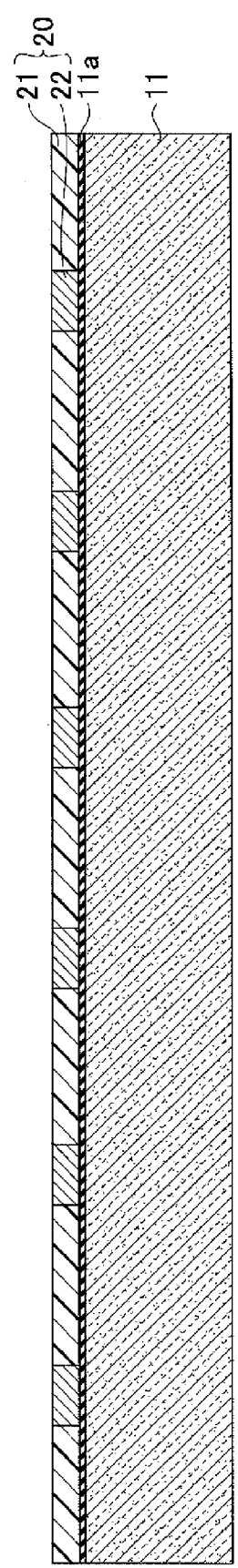

Then, in the process illustrated in FIG. 3, the stress buffer layer 21 is formed in the periphery of the penetration wiring 22. Thereby, the bonding layer 20 including the stress buffer layer 21 and the penetration wiring 22 is formed. In the process of forming the stress buffer layer 21, the penetration wiring 22 is covered with an insulating resin by applying an insulating resin liquid by using, for example, a spin-coating method or a roll-coating method. Then, after the coated insulating resin is cured, the insulating resin covering the penetration wiring 22 is removed by, for example, a CMP (Chemical Mechanical Polishing) method or a plasma ashing method. Thereby, the stress buffer layer 21 is formed on the first surface of the substrate body 11 interposed by the insulating film 11a. The first end surface of the penetration wiring 22 is exposed on the first surface of the stress buffer layer 21. The first end surface of the penetration wiring 21 and the first surface of the stress buffer layer 21 may be substantially flush with each other. The material and the thickness of the stress buffer layer 21 are the same as those of the above-described stress buffer layer 21. Alternatively, the stress buffer layer 21 may be formed by laminating a film-like insulating resin.

Next, the processes of forming the organic substrate 30 are described with reference to FIGS. 4 to 6. First, in the process illustrated in FIG. 4, the insulating layer 31 is formed covering the first surface of the bonding layer 20 (i.e. first end surface of the penetration wiring 22 and the first surface of the stress buffer layer 21). Then, the wiring layer 32 is layered on the insulating layer 31. For example, an insulating resin having an epoxy type resin as a main component may be used as the material of the insulating layer 31. The insulating layer 31 may include a filler such as silica ($SiO_2$). The thickness of the insulating layer 31 may be, for example, approximately 20 µm to 50 µm.

For example, in a case where the material used for the insulating layer 31 is a film-like insulating resin having an epoxy type resin as a main component and having a thermosetting property, the film-like insulating resin is laminated on the first end surface of the penetration wiring 22 and the first surface of the stress buffer layer 21. Then, the laminated insulating resin is cured by applying a pressing force to the insulating resin while heating the insulating resin to a temperature greater than or equal to a thermosetting temperature. Thereby, the insulating layer 31 is formed. It is to be noted that generation of voids can be prevented by laminating the insulating resin in a vacuum atmosphere.

For example, in a case where the material used for the insulating layer 31 is a liquid or a paste-like insulating resin having an epoxy type resin as a main component and having a thermosetting property, the liquid or paste-like insulating resin is applied on the first end surface of the penetration wiring 22 and the first surface of the stress buffer layer 21 by using, for example, a spin-coating method. Then, the coated insulating resin is cured by heating the insulating resin to a temperature greater than or equal to a thermosetting temperature. Thereby, the insulating layer 31 is formed.

Then, the via hole 31x is formed in the insulating layer 31. The via hole 31x penetrates the insulating layer 31 and exposes the first end surface of the penetration wiring 22. The via hole 31x may be formed by, for example, a laser processing method using a $CO_2$ laser. The via hole 31x includes an opening toward the insulating layer 33 (formed in a subsequent process) and an opening toward the penetration wiring 22 in which the opening toward the insulating layer 33 has an area larger than an area of the opening toward the penetration wiring 22. Other via holes are formed into the same shape as the via hole 31x by using the laser processing method. In a case where the via hole 31x is formed by using the laser processing method, it is preferable to remove residual resin of the insulating layer 31 adhered to the first end surface of the penetration wiring 22 exposed in the via hole 31x. In this case, a desmearing process may be used to remove the residual resin of the insulating layer.

Alternatively, a photosensitive insulating resin is used as the material of the insulating layer 31. In this case, the via hole 31x is formed by using a lithographic patterning method such as photolithography. Alternatively, the via hole 31x may be formed by performing a screen printing process on an insulating film including an opening part.

Then, the wiring layer 32 is formed on the first surface of the insulating layer 31. The wiring layer 32 includes a via wiring that fills the inside of the via hole 31x and a wiring pattern that is formed into a predetermined flat pattern (shape) on the first surface of the insulating layer 31. The wiring layer 32 is electrically connected to the penetration wiring 22 exposed in the via hole 31x. For example, a metal material having copper (Cu) as a main component may be used as the material of the wiring layer 32. The thickness of the wiring layer 32 may be, for example, approximately 10 μm to 20 μm. The wiring layer 32 may be formed by using various wiring forming methods such as a semi-additive method or a subtractive method.

Figure 4:
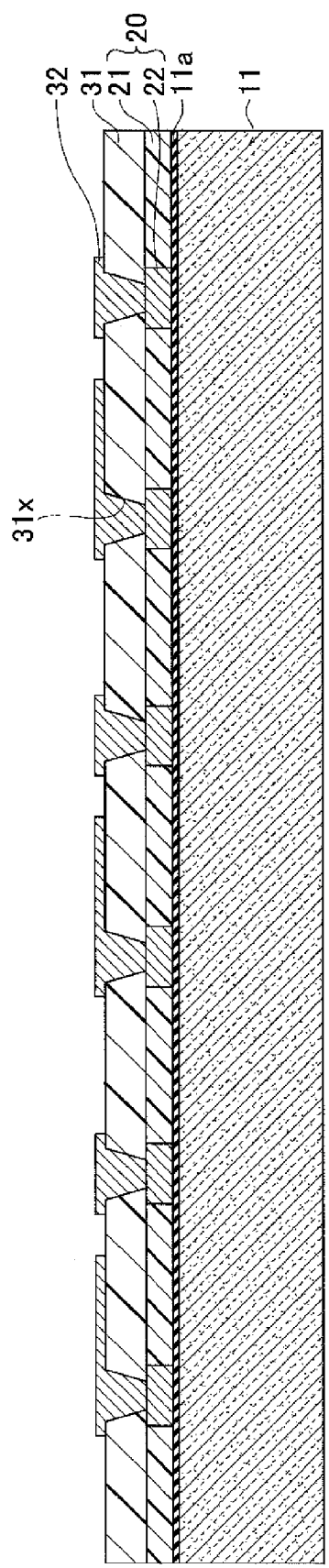
Figure 5:
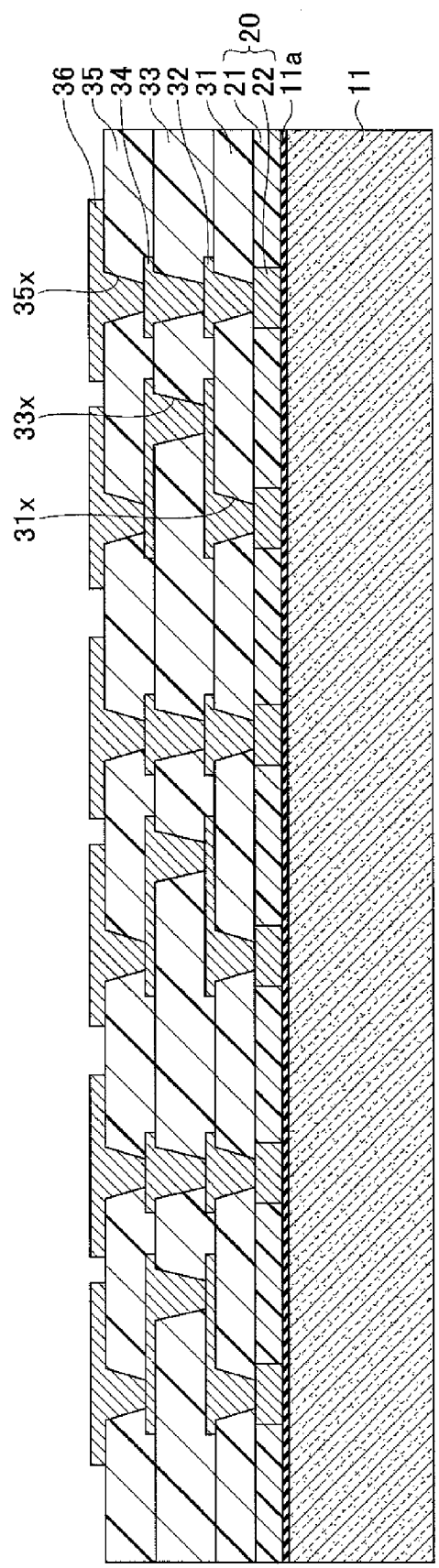

Then, by repeating the above-described processes illustrated in FIGS. 2-4, the insulating layer 33, the wiring layer 34, the insulating layer 35, and the wiring layer 36 are layered on the first surface of the insulating layer 31 as illustrated in FIG. 5. More specifically, in the process illustrated in FIG. 5, after the insulating layer 33 covering the wiring layer 32 is formed on the first surface of the insulating layer 31, the via hole 33x is formed. The via hole 33x penetrates the insulating layer 33 and exposes the first surface of the wiring layer 32. The material and the thickness of the insulating layer 33 may be the same as those of the insulating layer 31.

Then, the wiring layer 34 is formed on the first surface of the insulating layer 33. The wiring layer 34 is connected to the wiring layer 32 by way of the via hole 33x. The wiring layer 34 includes a via wiring that fills the inside of the via hole 33x and a wiring pattern that is formed on the first surface of the insulating layer 33. The wiring layer 34 is electrically connected to the wiring layer 32 exposed in the via hole 33x. The material of the wiring layer 34 and the thickness of the wiring pattern of the wiring layer 34 may be the same as those of the wiring layer 32.

Then, the insulating layer 35 covering the wiring layer 34 is formed on the first surface of the insulating layer 33. Then, the via hole 35x, which penetrates the insulating layer 35 and exposes the first surface of the wiring layer 34, is formed. The material and the thickness of the insulating layer 35 are the same as those of the insulating layer 31. Then, the wiring layer 36 is formed on the first surface of the insulating layer 35. The wiring layer 36 is connected to the wiring layer 34 by way of the via hole 35x. The wiring layer 36 includes a via wiring that fills the inside of the via hole 35x and a wiring pattern that is formed on the insulating layer 35. The wiring layer 36 is electrically connected to the wiring layer 34 exposed in the via hole 35x. The material of the wiring layer 36 and the thickness of the wiring pattern of the wiring layer 36 are substantially the same as those of the wiring layer 32.

Although a built-up wiring structure including 3 layers (wiring layers 32, 34, and 36) is formed in the above-described embodiment, a built-up wiring structure including n layers ("n" being an integer greater than or equal to 1) may be formed.

Figure 6:
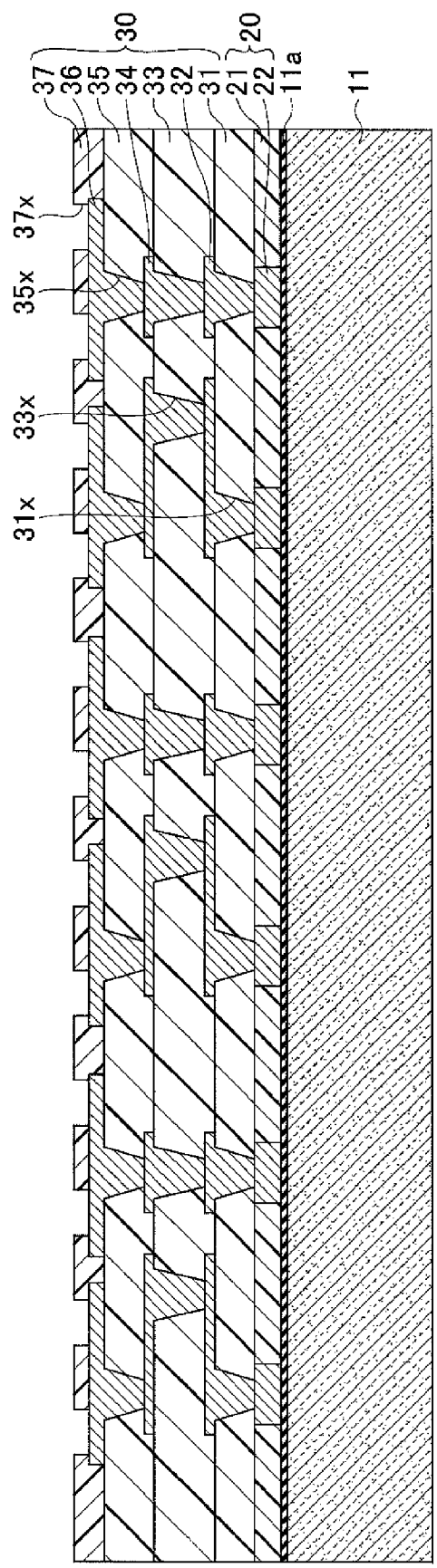

Then, in the process illustrated in FIG. 6, the insulating layer 37 including the opening part 37x is formed on the first surface of the insulating layer 35. The insulating layer 37 is a so-called solder resist layer. A part of the wiring layer 36 is exposed in the opening part 37x. In order to form the insulating layer 37 and the opening part 37x, first, a photosensitive resin compound (e.g., epoxy type resin, acrylic type resin) covering the wiring layer 36 is applied to the first surface of the insulating layer 35. Then, the applied photosensitive resin compound is exposed with light and developed. By performing the above-described processes of FIGS. 2-6, the manufacturing of the organic substrate 30 is completed.

Figure 7:
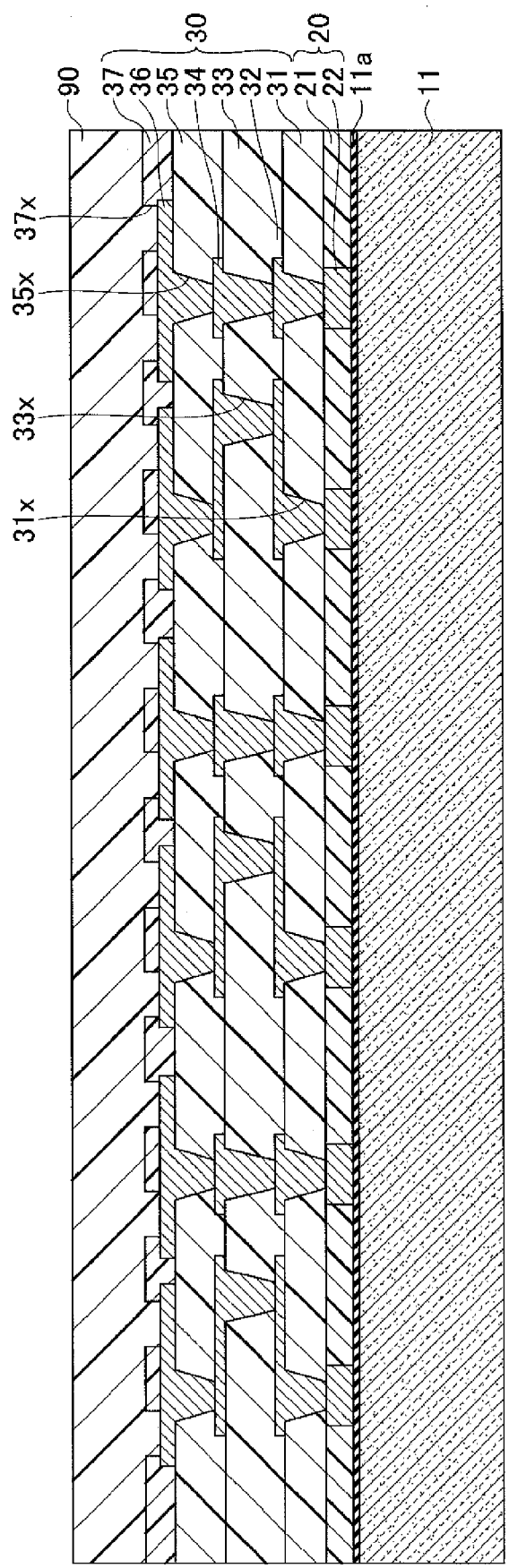

Then, in the process illustrated in FIG. 7, a supporting member 90 is formed on the first surface of the insulating layer 37. The supporting member 90 may be formed by, for example, laminating a polyimide film on the first surface of the insulating layer 37. Alternatively, a silicon board or a glass board may be adhered to the first surface of the insulating layer 37 by using an adhesive agent. The thickness of the supporting member may be, for example, approximately 500 μm. The purpose of forming the supporting member 90 is for maintaining the mechanical strength of the organic substrate 30 after the thickness of the substrate body 11 is reduced in a subsequent process. Therefore, the process of forming the supporting member 90 may be omitted in a case where the organic substrate 30 is able to maintain a sufficient mechanical strength in relation to, for example, the number of layers of the organic substrate or the thickness of the organic substrate.

Figure 8:
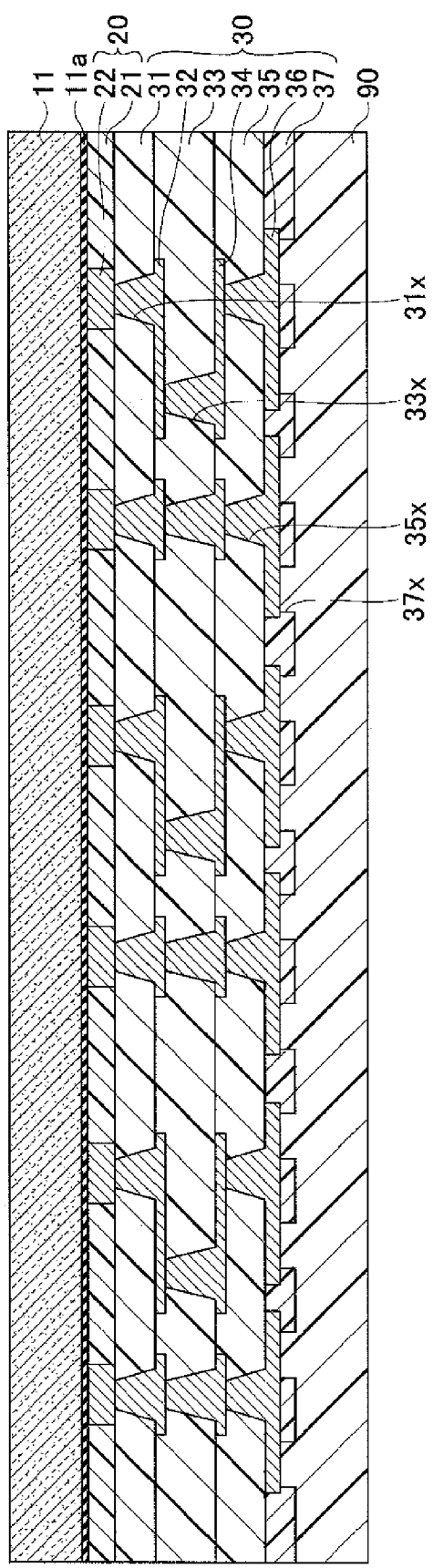

Then, in the process illustrated in FIG. 8, the thickness of the substrate body 11 is reduced. The thickness of the substrate body 11 is reduced by using, for example, a backside grinder. After the process of reducing the thickness of the substrate body 11, the thickness of the substrate body 11 may be, for example, approximately 200 μm to 300 μm. Reducing the thickness of the substrate body 11 facilitates the subsequent processes of forming the via hole 11x in the substrate body 11 or forming of the power-feeding layer (for performing an electroplating process) in the via hole 11x. It is to be noted that FIGS. 8-13 illustrate a state in which the configurations illustrated in FIGS. 2-7 are flipped vertically (i.e. upside down).

Figure 9:
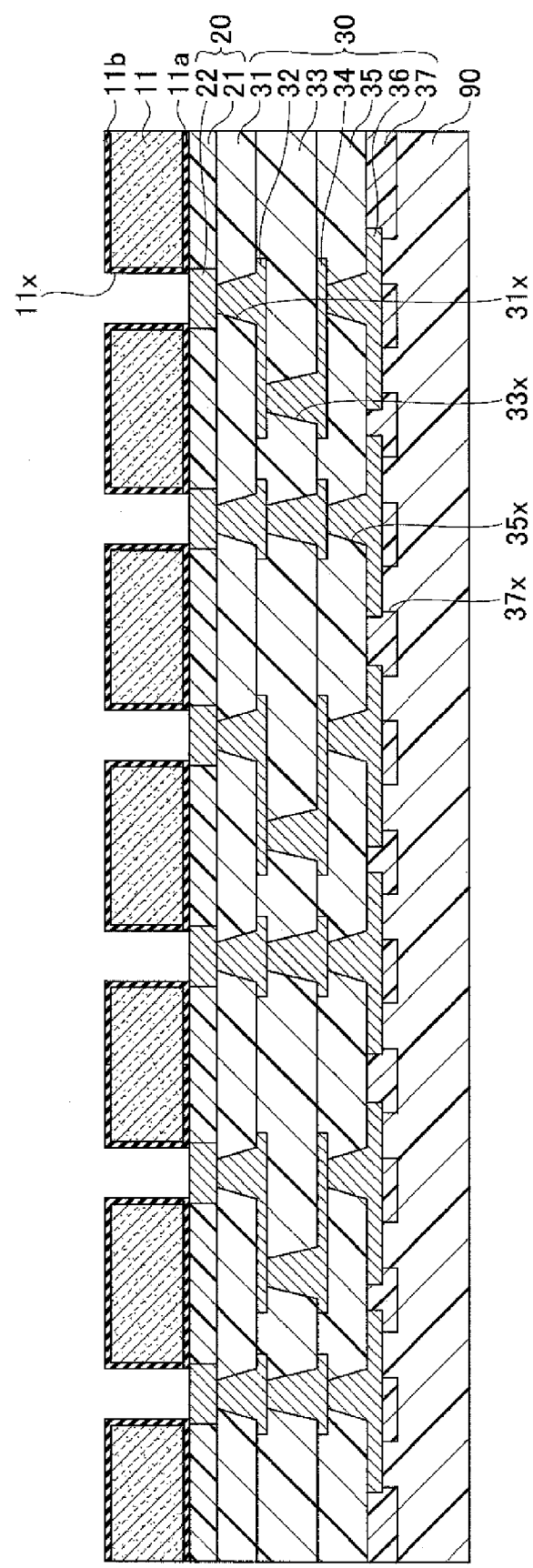

Then, in the process illustrated in FIG. 9, the via hole 11x, which penetrates the substrate body 11 and exposes the second end surface of the penetration wiring 22 of the bonding layer 20, is formed. The via hole 11x may be formed by forming a resist layer (not illustrated) having an opening(s) corresponding to a position at which the via hole 11x is to be formed and etching the substrate body 11 by using the resist layer as a mask. It is preferable to perform the etching by anisotropic etching such as (DRIE, Deep Reactive Ion Etching) using, for example, $SF_6$ (sulfur hexafluoride).

Alternatively, the via hole 11x may be formed by using a laser processing method (e.g., $CO_2$ laser). Alternatively, the via hole 11x may be formed by using a blasting method (e.g., wet blasting). The shape of the via hole 11x may be, for example, a circle in plan view. The diameter of the circle-shaped via hole 11x may be, for example, approximately 20 μm to 200 μm.

After the via hole 11x is formed, the insulating film 11b is formed on the second surface of the substrate body 11 and the inner wall surface of the via hole 11x. The insulating film 11b may be, a silicon dioxide ($SiO_2$) film, a silicon nitride (SiN) film, or a polyimide (PI) film formed by, for example, a CVD method or a PVD method. The thickness of the insulating film 11b may be, for example, approximately 1.5 μm to 3 μm.

Then, the insulating films 11a, 11b formed on the bottom part of the via hole 11x are removed by using, for example, an etching method. Thereby, the second end surface of the penetration wiring 22 is exposed in the bottom part of the via hole 11x.

Figure 10:
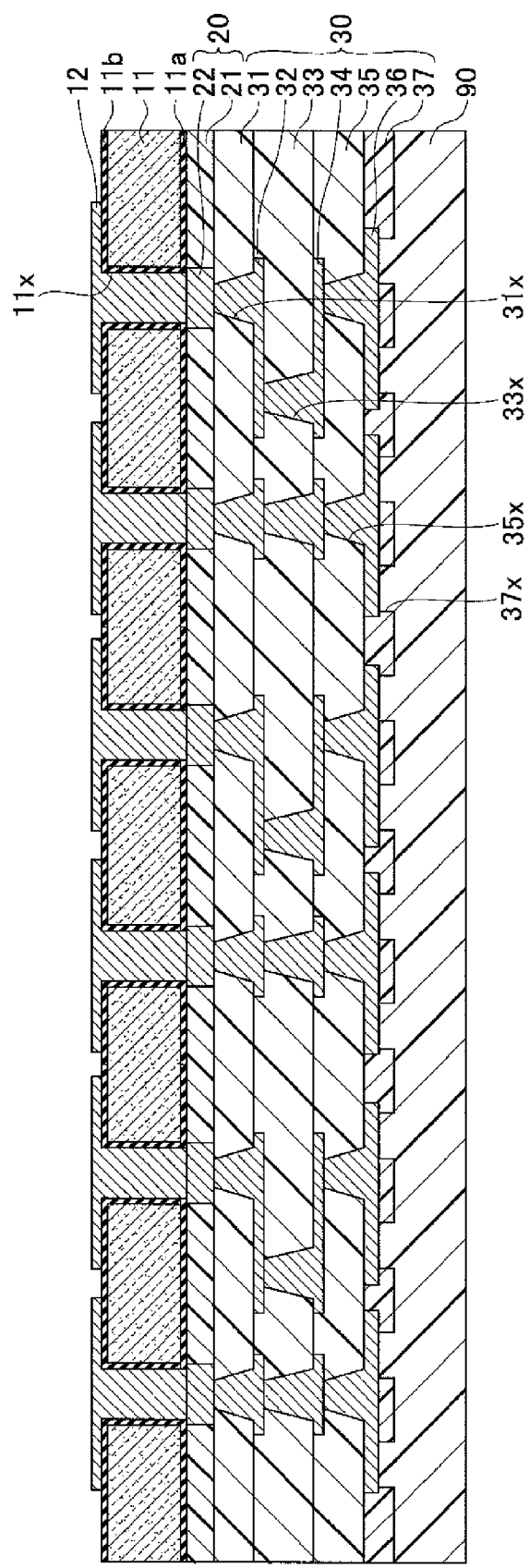

Then, in the process illustrated in FIG. 10, the wiring pattern 12 is formed on the substrate body 11. The wiring pattern 12 includes a via wiring that fills the inside of the via hole 11x interposed by the insulating film 11b and a flat wiring that is formed on the second surface of the substrate body 11 interposed by the insulating film 11b. The wiring pattern 12 is electrically connected to the penetration wiring 22 exposed in the via hole 11x. The material of the wiring pattern 12 and the thickness of the flat wiring of the wiring pattern 12 may be the same as those of the wiring layer 32. The wiring pattern 12 may be formed by various wiring forming methods such as a semi-additive method or a subtractive method.

Figure 11:
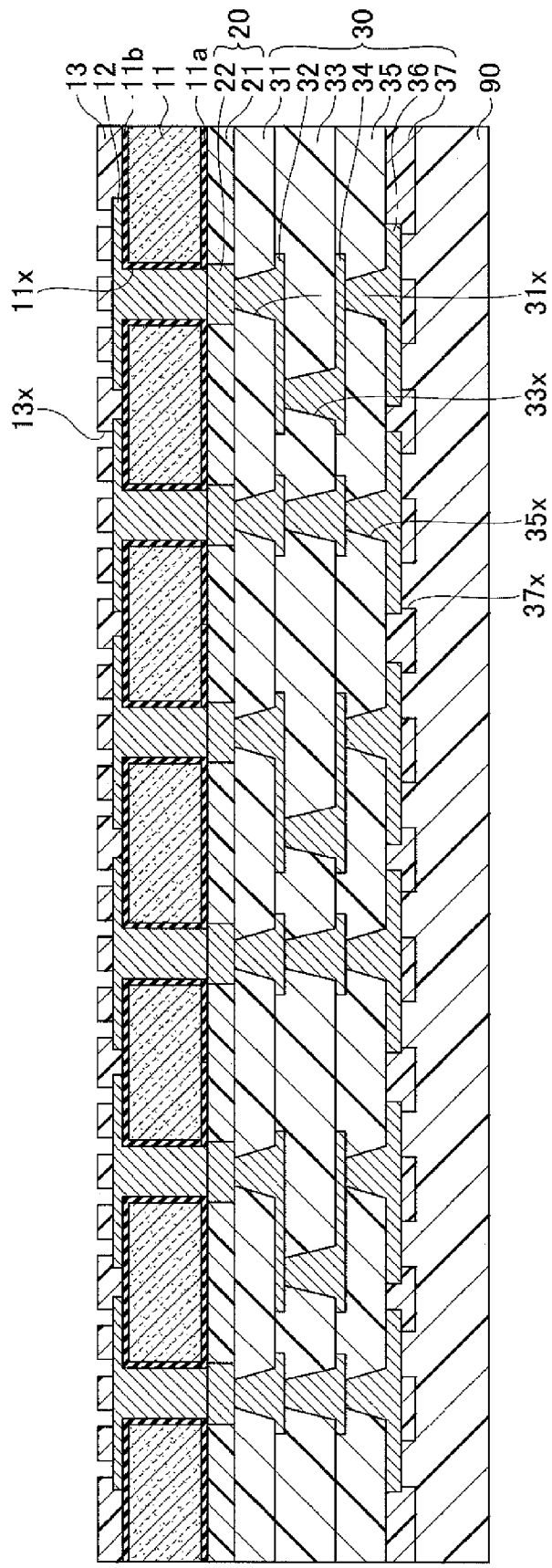

Then, in the process illustrated in FIG. 11, the insulating layer 13 including the opening part 13x is formed on the second surface of the substrate body 11. The insulating layer 13 is a so-called solder resist layer. A part of the wiring pattern 12 is exposed in the opening part 13x. In order to form the insulating layer 13 and the opening part 13x, first, a photosensitive resin compound (e.g., epoxy type resin, acrylic type resin) covering the wiring pattern 12 is applied to the second surface of the substrate body 11. Then, the applied photosensitive resin compound is exposed with light and developed.

A metal layer may be formed on the second surface of the wiring pattern 12 exposed in the opening part 13x according to necessity. The metal layer may be formed by, for example, an electroless plating method. The metal layer may be, for example, a gold layer, a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Figure 12:
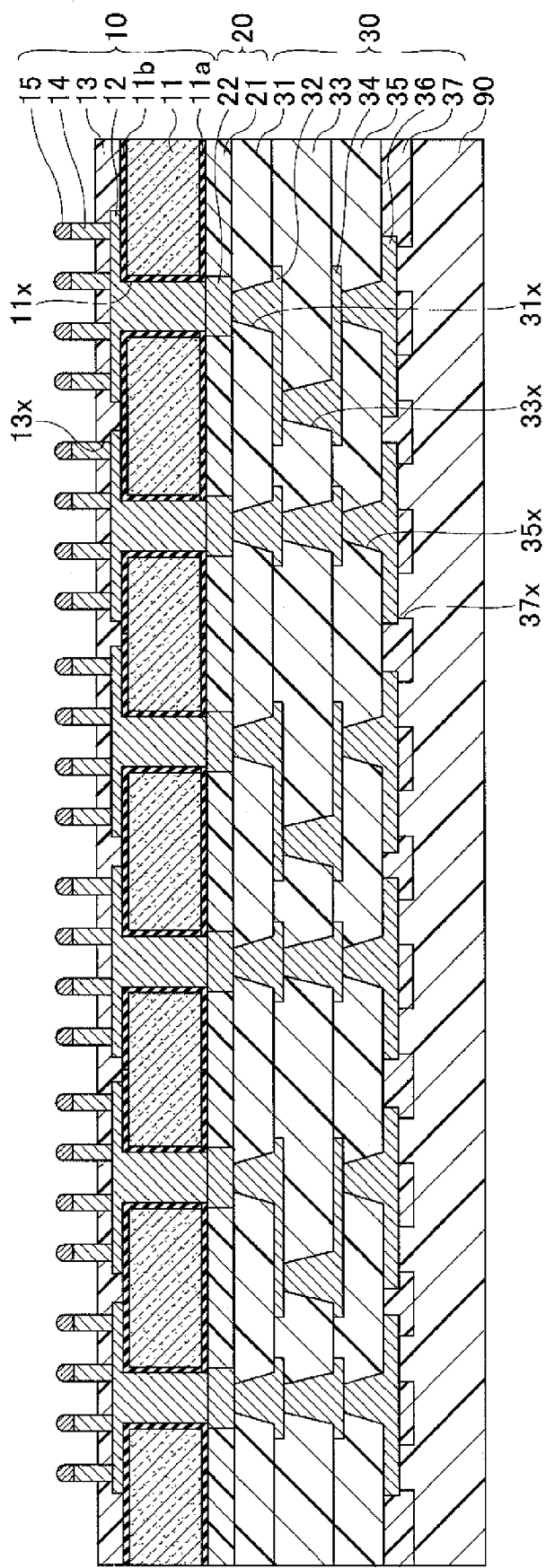

Then, in the process illustrated in FIG. 12, the metal column 14 and the metal layer 15 are formed, in this order, on the second surface of the wiring pattern 12 exposed in the opening part 13x. Thereby, the manufacturing of the inorganic substrate 10 is completed. The metal column 14 may be formed as follows. First, a third metal layer (not illustrated) is formed on the second surface of the insulating layer 13, the inner wall surface of the opening part 13x, and the second surface of the wiring pattern 12 exposed in the opening part 13x. For example, the third metal layer may be formed of a metal material having copper (Cu) as a main component. The third metal layer may be formed by, for example, an electroless plating method, a CVD method, or a PVD method. Then, a resist layer (not illustrated) including an opening part may be formed on the second surface of the third metal layer. The opening part of the resist layer exposes a part at which the metal column 14 is to be formed.

Then, a fourth metal layer (not illustrated) having, for example, copper (Cu) as a main component is formed (layered) on the second surface of the third metal layer exposed in the opening part of the resist layer. The fourth metal layer is formed to a predetermined height by an electroplating method using the third metal layer as a power feeding layer. According to necessity, the resist layer and the second surface of the fourth metal layer may be flattened by using, for example, a polishing method (CMP method). Then, the resist layer is removed. Then, the part of the third metal layer which is not covered by the fourth metal layer is removed by using the fourth metal layer as a mask and etching the part of the third metal layer which is not covered by the fourth metal layer. Thereby, the metal column 14 having the fourth metal layer formed on the third metal layer is formed.

Then, the metal layer 15 is formed by, for example, applying a paste-like metal material on the second surface of the metal column 14. Similar to the metal column 14, the metal layer 15 may be formed by using an electroplating method. For example, solder may be used as the material of the metal layer 15. The solder may be, for example, an alloy including lead (Pb), an alloy including tin (Sn) and copper (Cu), or an alloy including tin (Sn), silver (Ag), and copper (Cu). Alternatively, the material of the metal layer 15 may be, for example, a copper/nickel/gold (Cu/Ni/Au) layer (i.e. metal layer including a Cu layer, a Ni layer, and a Au layer layered in this order) or a copper/nickel/palladium/gold (Cu/Ni/Pd/Au) layer (i.e. meta layer including a Cu layer, a Ni layer, a Pd layer, and a gold layer layered in this order).

Figure 13:
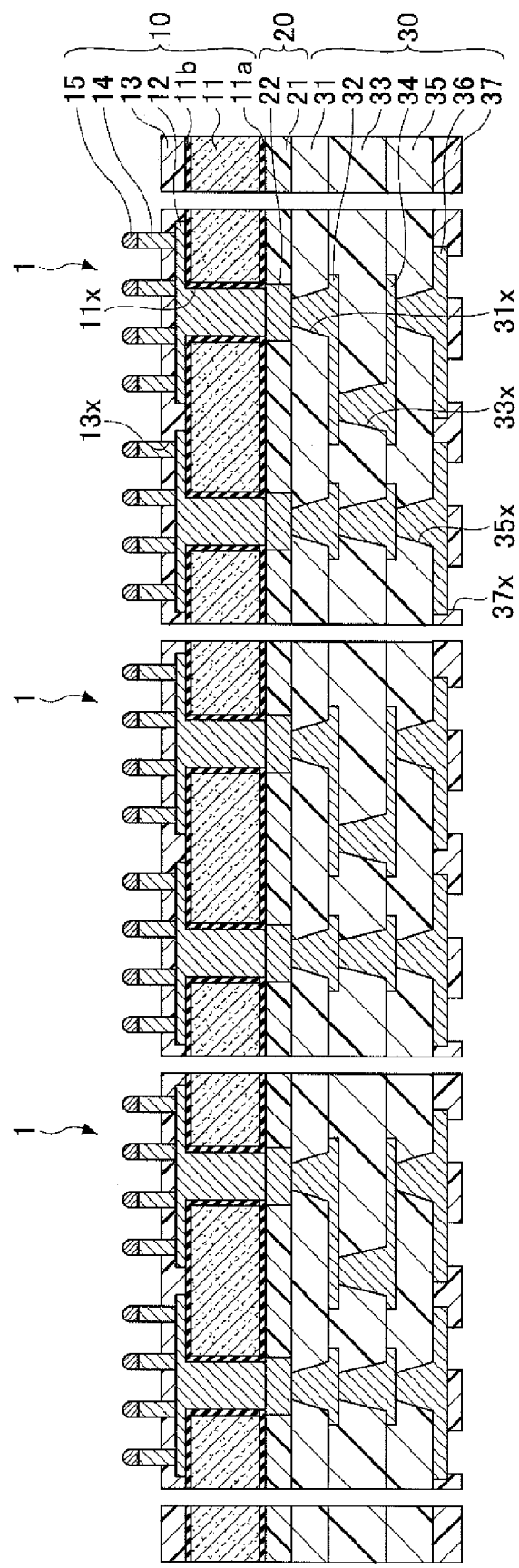

Then, in the process illustrated in FIG. 13, after the supporting member 90 is removed from the structure illustrated in FIG. 12, the structure is cut into individual pieces by cutting predetermined parts of the structure with a dicer or the like. Thereby, the manufacturing of the wiring substrate 1 is completed. The supporting member 90 may be removed by, for example, mechanically peeling the supporting member 90.

After the supporting member 90 is removed from the structure illustrated in FIG. 12, a metal layer may be formed on the first surface of the wiring layer 36 exposed in the opening part 37x according to necessity.

The metal layer may be formed by, for example, an electroless plating method. The metal layer may be, for example, a gold layer, a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Further, an external connection terminal (e.g., solder ball, lead pin) may be formed on the wiring layer 36 exposed in the opening part 37x. The external connection terminal acts as a terminal that electrically connects the wiring substrate 1 to the mounting substrate (not illustrated) such as a motherboard. Alternatively, the wiring layer 36 exposed in the opening part 37x may be used as an external connection terminal. Further, after the supporting member 90 is removed from the structure illustrated in FIG. 12, the external connection terminal may be formed before or after the structure is cut into individual pieces.

After performing the process illustrated in FIG. 13, the external connection terminal may be formed on the wiring layer 36 exposed in the opening part 37x. Further, the supporting member 90, which covers the external connection terminal, may be formed on the first surface of the insulating layer 37.

Accordingly, the wiring substrate 1 according to the above-described embodiment includes a structure having the inorganic substrate 10 integrated with the organic substrate 30 and the stress buffer layer 21 interposed therebetween. Accordingly, because the stress buffer layer 21 reduces the stress generated at the bonding part between the inorganic substrate 10 and the organic substrate 30, the connection reliability between the inorganic substrate 10 and the organic substrate 30 can be improved.

Because a via hole and a wiring pattern can be formed in the substrate body 11 made of silicon or the like by using a semiconductor process, an ultra-fine via hole 11x, an ultra-fine wiring pattern 12, or narrow-pitched connection terminals (metal columns 14) can be formed.

Further, in the wiring substrate 1, the side of the wiring substrate 1 in which the inorganic substrate 19 is formed corresponds to the side of the wiring substrate 1 on which a semiconductor chip is mounted. Further, the side of the wiring substrate 1 in which the organic substrate 30 is formed corresponds to the side of the wiring substrate 1 to which a mounting substrate (e.g., motherboard) is connected. Accordingly, a mismatch of thermal expansion coefficients among the semiconductor chip, the wiring substrate 1, and the mounting substrate (e.g., motherboard) can be prevented.

In a wiring substrate of a related art example, a semiconductor chip is mounted on an organic substrate interposed by a silicon interposer. The processes for manufacturing the wiring substrate of the related art example becomes complicated because a process of mounting the silicon interposer on the inorganic substrate and a process of mounting the semiconductor chip on the silicon interposer are required. Because the wiring substrate 1 has a structure in which the inorganic substrate 10 and the organic substrate 30 are integrated and the stress buffer layer 21 is interposed therebetween, the semiconductor chip can be directly mounted on the inorganic substrate 10. Therefore, the process of mounting a silicon interposer on an organic substrate can be omitted. Accordingly, processes for manufacturing the wiring substrate 1 according to an embodiment of the present invention can be simplified.

Further, the stress buffer layer 21 having a thermal expansion coefficient greater than that of the inorganic substrate 10 and less than that of the organic substrate 30 is interposed between the inorganic substrate 10 and the organic substrate 30. Further, the organic substrate 30 has a thermal expansion coefficient greater than that of the stress buffer layer 21 and less than that of the mounting substrate (e.g., motherboard). Accordingly, the thermal expansion coefficient gradually increases from the inorganic substrate 10 to the mounting substrate (e.g., motherboard). Thus, the stress generated between the inorganic substrate 10 and the organic substrate 30 can be reduced and connection reliability between the inorganic substrate 10 and the organic substrate 30 can be improved. Similar to the thermal expansion coefficient, the stress generated between the inorganic substrate 10 and the organic substrate 30 can be reduced and connection reliability between the inorganic substrate 10 and the organic substrate 30 can be improved owing to the Young's modulus of the stress buffer layer 21.

Modified Example of First Embodiment

In the modified example of the first embodiment, a method for manufacturing the wiring substrate 1, which is different from that of the first embodiment, is described. In the modified example of the first embodiment, like components are denoted by like reference numerals as those of the first embodiment and are not further explained.

Figure 14:
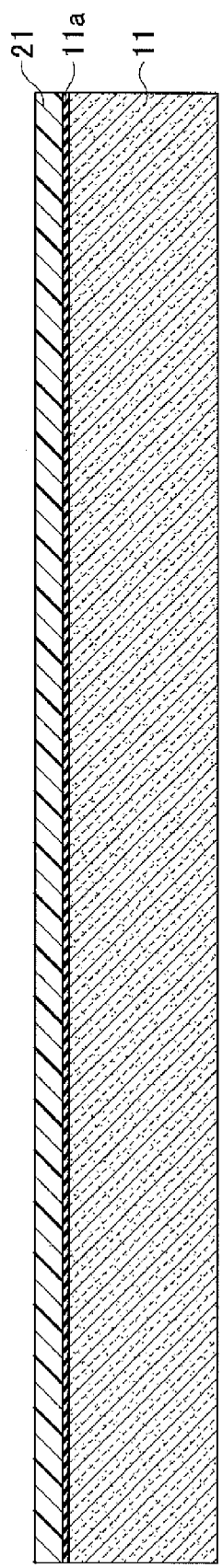
FIGS. 14-16 are schematic diagrams for describing processes performed in a method for manufacturing a wiring substrate according to a modified example of the first embodiment of the present invention.
Figure 15:
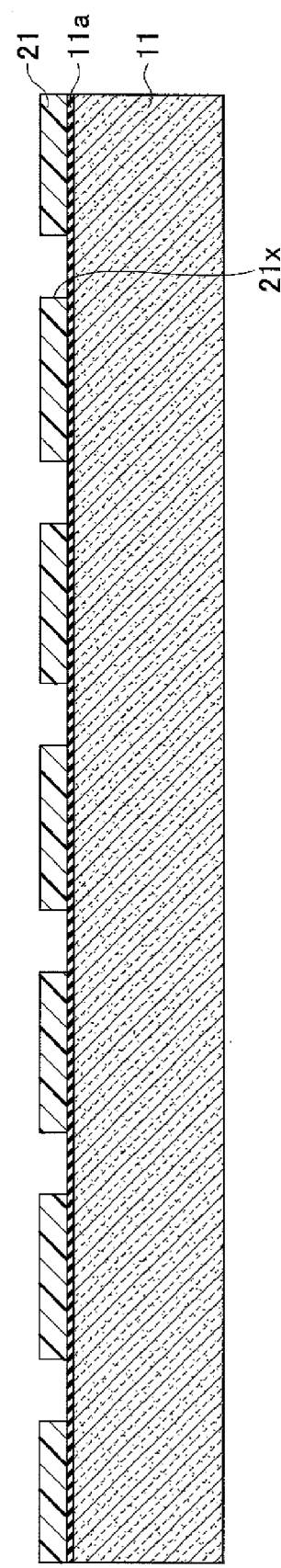
Figure 16:
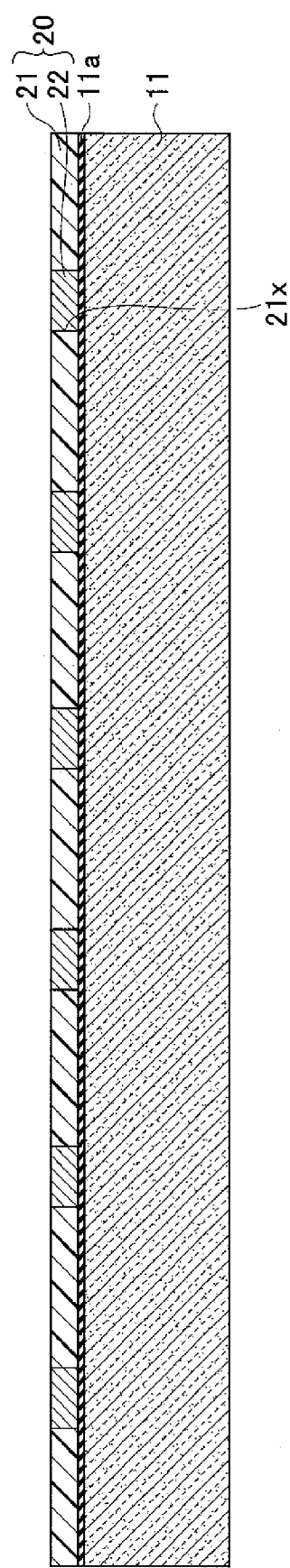

FIGS. 14-16 are schematic diagrams for describing processes in manufacturing the wiring substrate according to the modified example of the first embodiment of the present invention. The processes illustrated in FIGS. 2 and 3 may be replaced with the below-described processes illustrated in FIGS. 14-16.

First, in the process illustrated in FIG. 14, the stress buffer layer 21 is formed on the first surface of the substrate body 11 interposed by the insulating film 11a. The stress buffer layer 21 may be formed by applying a photosensitive insulating resin liquid with, for example, a spin-coating method or a roll coating method. The material and the thickness of the stress buffer layer 21 is the same as those of the stress buffer layer 21 described above.

Then, in the process illustrated in FIG. 15, the opening part 21x is formed in the stress buffer layer 21 by using a predetermined mask and performing exposure and development on the stress buffer layer 21. A part of the insulating film 11a, which is formed on the first surface of the substrate body 11, is exposed in the opening part 21x. The opening part 21x is formed in a shape and position corresponding to the pattern of the penetration wiring 22.

Then, in the process illustrated in FIG. 16, the penetration wiring 22 is formed on the insulating film 11a exposed in the opening part 21x. Thereby, the bonding layer 20 is formed. The penetration wiring 22 may be formed by using, for example, a semi-additive method. Alternatively, the penetration wiring 22 may be formed by filling the inside of the opening part 21x with a metal paste.

Hence, according to the modified example of the first embodiment, the processes illustrated in FIGS. 2 and 3 may be replaced with the processes illustrated in FIGS. 14-16.

Second Embodiment

In the second embodiment of the present invention, an example of a semiconductor package including a semiconductor chip mounted on the wiring substrate 1 of the first embodiment is described. In the second embodiment, like components are denoted with like reference numerals as those of the first embodiment and are not further explained.

Figure 17:
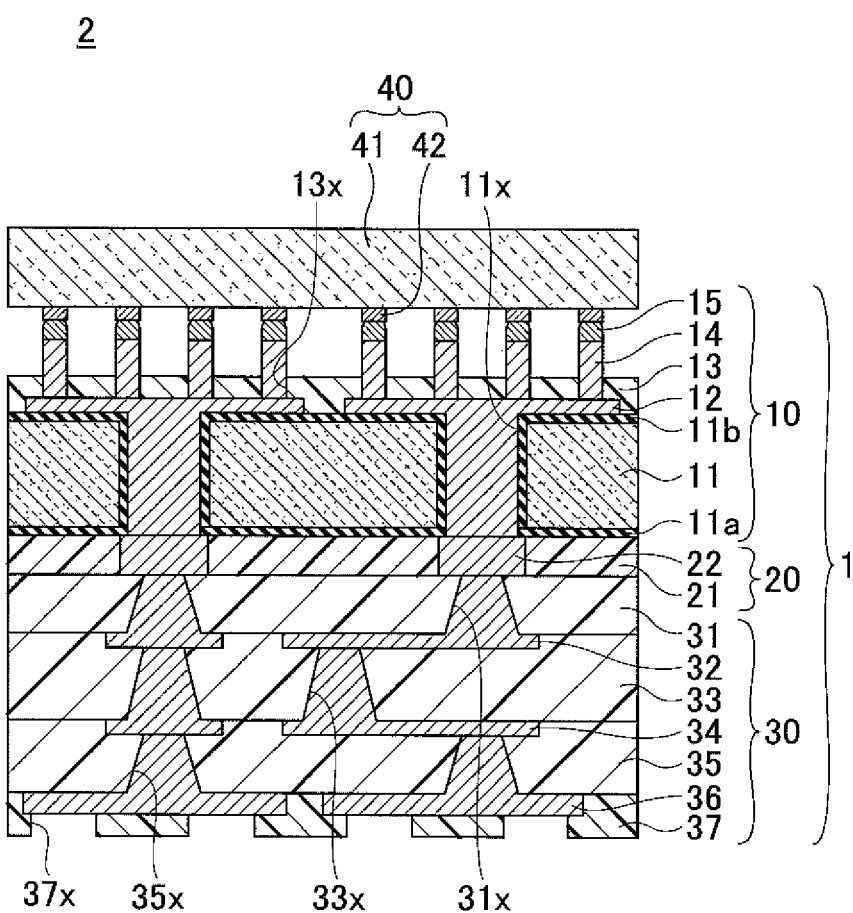
FIG. 17 is a cross-sectional view illustrating a semiconductor package according to the second embodiment of the present invention.

FIG. 17 is a cross-sectional view illustrating a semiconductor package 2 according to the second embodiment of the present invention. With reference to FIG. 17, the semiconductor package 2 includes the wiring substrate 1 of FIG. 1 and a semiconductor chip 40.

The semiconductor chip 40 includes a main body 41 and an electrode pad(s) 42. The main body 41 may include a semiconductor substrate (not illustrated) having a semiconductor integrated circuit (not illustrated) mounted thereon. For example, the semiconductor substrate (not illustrated) may be made of silicon and formed into a thin sheet. The electrode pad 42 is formed on the main body 41. The electrode pad 42 is electrically connected to, for example, a semiconductor integrated circuit (not illustrated). For example, aluminum (Al) may be used as the material of the electrode pad 42. The electrode pad 42 is positioned opposite to the metal column 14 and the metal layer 15. The electrode pad 42 is electrically connected to the metal column 14 interposed by the metal layer 15.

Although a single semiconductor chip 40 is mounted on the wiring substrate 1 in the example illustrated in FIG. 17, plural semiconductor chips 40 may be mounted on the wiring substrate 1. In a case where plural semiconductor chips 40 are mounted, the plural semiconductor chips 40 may have the same function or may be a mixture of same functions and different functions.

With the second embodiment, a semiconductor package having a semiconductor chip mounted on the wiring substrate 1 of the first embodiment can be obtained. That is, a semiconductor package including pads arranged with a narrow pitch can be provided on a wiring substrate having high connection reliability.

In a related art example, there is a case where plural packaged semiconductor chips are mounted on a motherboard. This case has a problem in which the plural packaged semiconductor chips take up a large part of the area on the motherboard. With the wiring substrate 1, plural unpackaged semiconductor chips can be mounted on the wiring substrate 1. Accordingly, the wiring substrate 1 having plural unpackaged semiconductor chips mounted thereon can be mounted on a motherboard. Accordingly, the area of the motherboard on which the plural unpackaged semiconductor chips are mounted can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring substrate comprising:
an inorganic substrate including a substrate body formed of an inorganic material, a wiring pattern formed on the substrate body, and an external connection terminal being electrically connected to the wiring pattern;

an organic substrate that is formed below the inorganic substrate, the organic substrate including an insulating layer and a wiring layer formed on the insulating layer; and a bonding layer interposed between the inorganic substrate and the organic substrate, the bonding layer including a stress buffer layer and a penetration wiring that penetrates the stress buffer layer;

wherein a thermal expansion coefficient of the stress buffer layer is greater than a thermal expansion coefficient of the inorganic substrate and less than a thermal expansion coefficient of the organic substrate;

wherein the wiring pattern and the wiring layer are electrically connected by way of the penetration wiring.

2. The wiring substrate as claimed in claim 1, wherein the external connection terminal is configured to have a semiconductor chip mounted thereon.

3. The wiring substrate as claimed in claim 1,
wherein the substrate body includes a via hole formed by penetrating the substrate body and has a first surface contacting the bonding layer and a second surface on an opposite side of the first surface of the substrate body,
wherein the wiring pattern includes a via wiring formed in the via hole and a flat wiring formed on the second surface of the substrate body;
wherein the external connection terminal includes a metal column.

4. A semiconductor package comprising:
the wiring substrate of claim 1;
a semiconductor chip including an electrode pad disposed on the external connection terminal of the inorganic substrate;
wherein the electrode pad is in a position facing the external connection terminal;
wherein the electrode pad is electrically connected to the external connection terminal.

5. A wiring substrate comprising:
an inorganic substrate including a substrate body formed of an inorganic material, a wiring pattern formed on the substrate body, and an external connection terminal being electrically connected to the wiring pattern;
an organic substrate that is formed below the inorganic substrate, the organic substrate including an insulating layer and a wiring layer formed on the insulating layer; and
a bonding layer interposed between the inorganic substrate and the organic substrate, the bonding layer including a stress buffer layer and a penetration wiring that penetrates the stress buffer layer;
wherein the stress buffer layer is formed of an elastic material;
wherein the wiring pattern and the wiring layer are electrically connected by way of the penetration wiring.

6. The wiring substrate as claimed in claim 5, wherein the external connection terminal is configured to have a semiconductor chip mounted thereon.

7. The wiring substrate as claimed in claim 5, the stress buffer layer has a Young's modulus ranging from 50 MPa to 1000 MPa.

8. The wiring substrate as claimed in claim 5,
wherein the substrate body includes a via hole formed by penetrating the substrate body and has a first surface contacting the bonding layer and a second surface on an opposite side of the first surface of the substrate body,
wherein the wiring pattern includes a via wiring formed in the via hole and a flat wiring formed on the second surface of the substrate body;
wherein the external connection terminal includes a metal column.

9. A semiconductor package comprising:
the wiring substrate of claim 5;
a semiconductor chip including an electrode pad disposed on the external connection terminal of the inorganic substrate;
wherein the electrode pad is in a position facing the external connection terminal;
wherein the electrode pad is electrically connected to the external connection terminal.

10. A method for manufacturing a wiring substrate, the method comprising:
forming a stress buffer layer on a first surface of a substrate body formed of an inorganic material;
forming a penetration wiring that penetrates the stress buffer layer;
forming an organic substrate that is electrically connected to the penetration wiring, the organic substrate including an insulating layer and a wiring layer formed on the insulating layer;
forming a via hole by penetrating the substrate body, the via hole exposing an end surface of the penetration wiring;
forming a wiring pattern on a second surface of the substrate body, the wiring pattern being electrically connected to the penetration wiring by way of the via hole;
forming an external connection terminal on the wiring pattern, the external connection terminal including a metal column;
wherein the stress buffer layer is interposed between the first surface of the substrate body and the organic substrate;
wherein the stress buffer layer is formed by using a material having a thermal expansion coefficient that is greater than a thermal expansion coefficient of the inorganic material and less than a thermal expansion coefficient of the organic substrate.

11. The method as claimed in claim 10, wherein the forming of the stress buffer layer includes
forming a patterned penetration wiring on the first surface of the substrate body,
forming the stress buffer layer that covers the patterned penetration wiring on the first surface of the substrate body, and
exposing an end part of the patterned penetration wiring by polishing the stress buffer layer.

12. The method as claimed in claim 10, further comprising:
forming a via hole in the stress buffer layer, the via hole exposing a part of the first surface of the substrate body; and
forming a penetration wiring filling the inside of the via hole;
wherein the forming of the stress buffer layer includes forming the stress buffer layer entirely on the first surface of the substrate body.

13. A method for manufacturing a wiring substrate, the method comprising:
forming a stress buffer layer on a first surface of a substrate body formed of an inorganic material;
forming a penetration wiring that penetrates the stress buffer layer;
forming an organic substrate that is electrically connected to the penetration wiring, the organic substrate including an insulating layer and a wiring layer formed on the insulating layer;

forming a via hole by penetrating the substrate body, the via hole exposing an end surface of the penetration wiring;

forming a wiring pattern on a second surface of the substrate body, the wiring pattern being electrically connected to the penetration wiring by way of the via hole;

forming an external connection terminal on the wiring pattern, the external connection terminal including a metal column;

wherein the stress buffer layer is interposed between the first surface of the substrate body and the organic substrate;

wherein the stress buffer layer is formed by using an elastic material.

14. The method as claimed in claim 13, wherein the forming of the stress buffer layer includes forming a patterned penetration wiring on the first surface of the substrate body, forming the stress buffer layer that covers the patterned penetration wiring on the first surface of the substrate body, and exposing an end part of the patterned penetration wiring by polishing the stress buffer layer.

15. The method as claimed in claim 13, further comprising:

forming a via hole in the stress buffer layer, the via hole exposing a part of the first surface of the substrate body; and forming a penetration wiring filling the inside of the via hole;

wherein the forming of the stress buffer layer includes forming the stress buffer layer entirely on the first surface of the substrate body.

* * * * *